(12) United States Patent
Chudzik et al.

(10) Patent No.: US 9,524,986 B2
(45) Date of Patent: Dec. 20, 2016

(54) TRAPPING DISLOCATIONS IN HIGH-MOBILITY FINS BELOW ISOLATION LAYER

(71) Applicant: GLOBALFOUNDRIES INC., Grand Cayman (KY)

(72) Inventors: Michael P. Chudzik, Danbury, CT (US); Ramachandra Divakaruni, Ossining, NY (US); Judson R. Holt, Wappingers Falls, NY (US); Arvind Kumar, Chappaqua, NY (US); Unoh Kwon, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 148 days.

(21) Appl. No.: 14/315,362

(22) Filed: Jun. 26, 2014

(65) Prior Publication Data
US 2015/0380438 A1 Dec. 31, 2015

(51) Int. Cl.
| | |
|---|---|
| H01L 21/02 | (2006.01) |
| H01L 27/12 | (2006.01) |
| H01L 29/78 | (2006.01) |
| H01L 29/66 | (2006.01) |
| H01L 21/84 | (2006.01) |
| H01L 21/306 | (2006.01) |

(Continued)

(52) U.S. Cl.
CPC ....... *H01L 27/1207* (2013.01); *H01L 21/0243* (2013.01); *H01L 21/02529* (2013.01); *H01L 21/02532* (2013.01); *H01L 21/02543* (2013.01); *H01L 21/02546* (2013.01); *H01L 21/02639* (2013.01); *H01L 21/30604* (2013.01); *H01L 21/31053* (2013.01); *H01L 21/31111* (2013.01); *H01L 21/845* (2013.01); *H01L 27/1211* (2013.01); *H01L 29/16* (2013.01); *H01L 29/66795* (2013.01); *H01L 29/7851* (2013.01)

(58) Field of Classification Search
CPC .............. H01L 27/1207; H01L 27/1211; H01L 21/0243; H01L 21/02529; H01L 21/02532; H01L 21/02543; H01L 21/02546; H01L 21/02639; H01L 21/30604; H01L 21/31053; H01L 21/31111; H01L 21/845; H01L 29/16; H01L 29/66795; H01L 29/7851
See application file for complete search history.

(56) References Cited

U.S. PATENT DOCUMENTS

| | | | |
|---|---|---|---|
| 7,470,578 | B2 | 12/2008 | Nowak et al. |
| 7,728,360 | B2 | 6/2010 | Chen et al. |

(Continued)

FOREIGN PATENT DOCUMENTS

KR    20070027121 A    3/2007

*Primary Examiner* — Andy Huynh
*Assistant Examiner* — Juanita Rhodes
(74) *Attorney, Agent, or Firm* — Scully Scott Murphy and Presser; Frank Digiglio

(57) ABSTRACT

The present invention relates generally to semiconductor devices and more particularly, to a structure and method of forming a high-mobility fin field effect transistor (finFET) fin in a silicon semiconductor on insulator (SOI) substrate by trapping crystalline lattice dislocations that occur during epitaxial growth in a recess formed in a semiconductor layer. The crystalline lattice dislocations may remain trapped below a thin isolation layer, thereby reducing device thickness and the need for high-aspect ratio etching and fin formation.

15 Claims, 9 Drawing Sheets

(51) Int. Cl.
*H01L 21/311* (2006.01)
*H01L 29/16* (2006.01)
*H01L 21/3105* (2006.01)

(56) References Cited

U.S. PATENT DOCUMENTS

| | | | |
|---|---|---|---|
| 8,101,486 B2 | 1/2012 | Maszara et al. | |
| 8,106,459 B2 | 1/2012 | Chang et al. | |
| 8,395,195 B2 | 3/2013 | Chang et al. | |
| 2005/0110087 A1 | 5/2005 | Natzle et al. | |
| 2007/0267722 A1* | 11/2007 | Lochtefeld | H01L 21/02381 257/618 |
| 2009/0121288 A1 | 5/2009 | Patruno | |
| 2010/0252816 A1* | 10/2010 | Ko | H01L 29/66818 257/24 |
| 2013/0196478 A1 | 8/2013 | Chang et al. | |
| 2013/0270559 A1* | 10/2013 | Hafez | H01L 27/11206 257/50 |

* cited by examiner

TRAPPING DISLOCATIONS IN HIGH-MOBILITY FINS BELOW ISOLATION LAYER

BACKGROUND

The present invention relates generally to semiconductor devices and more particularly, to a structure and method of forming a high-mobility fin in a hybrid fin field effect transistor (finFET) device.

Germanium is a commonly known semiconductor material. The high electron mobility and higher hole mobility of germanium are greater than that of silicon, and make germanium an excellent material in the formation of integrated circuits. Germanium-on-insulator (GOI) structures may be used to fabricate finFET devices, but the price of GOI substrates, and especially strained GOI (SGOI) substrates, may be significantly higher than that of silicon substrates. A more cost effective alternative of utilizing germanium in finFET devices is to form a silicon germanium fin on a silicon semiconductor on insulator (SOI) substrate.

SUMMARY

According to an embodiment, a method is disclosed. The method may include: forming a recess in a semiconductor on insulator (SOI) substrate, the recess located in a semiconductor layer and below an isolation layer; and epitaxially growing a material having high electron mobility properties in the recess to form a high-mobility fin, the high-mobility fin having one or more crystalline lattice dislocations only in the recess, and the high-mobility fin extending above the isolation layer.

According to another embodiment, a method is disclosed. The method may include: forming a fin on an isolation layer, the fin comprising a portion of a semiconductor on insulator (SOI) layer; forming a hardmask on the fin; depositing a filler material on the isolation layer adjacent to the fin, the filler material directly contacting a sidewall of the fin and a sidewall of the hardmask; forming a patterning layer on the hardmask and the filler material; forming an opening in the patterning layer, the opening exposing the hardmask and only a portion of the filler material; forming a fin trench by removing the hardmask, the fin, and a portion of the isolation layer below the fin selective to the filler material, the fin trench exposing a portion of a semiconductor layer; forming a recess in the exposed portion of the semiconductor layer, the recess located below the isolation layer; and epitaxially growing a material having high electron mobility properties in the recess to form a high-mobility fin, the high-mobility fin having one or more crystalline lattice dislocations located only in the recess, and the high-mobility fin extending above the isolation layer.

According to another embodiment, a structure is disclosed. The structure may include: a semiconductor layer; an isolation layer on the semiconductor layer; and a high-mobility fin having a base region located below the isolation layer in the semiconductor layer, wherein the high-mobility fin extends above the isolation layer, and wherein one or more dislocations in a crystalline lattice of the high-mobility fin are located only in the base region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
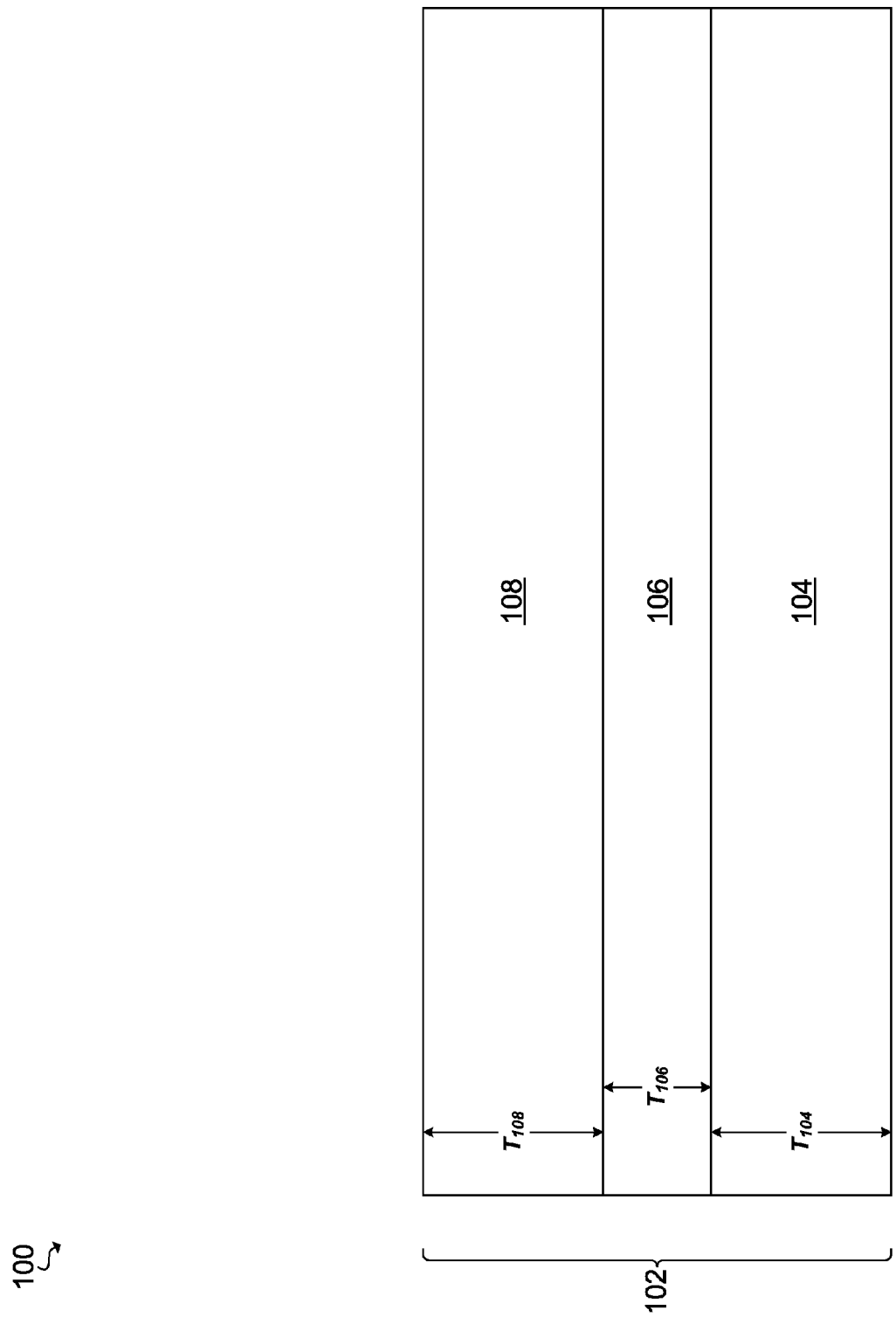
FIG. 1 is a cross section view illustrating a structure, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor devices and more particularly, to a structure and method of forming a high-mobility fin in a silicon semiconductor on insulator (SOI) substrate by trapping dislocations that occur during fin formation in a recess below a thin insulator layer. Conventionally, silicon germanium fins may be formed on a silicon SOI substrate by removing a second fin between a first fin and a third fin, forming a recess in a portion of the isolation layer below the second fin to expose an upper surface of a semiconductor layer, and then epitaxially growing silicon germanium on the upper surface of the semiconductor layer.

However, when an epitaxial material has a different lattice constant than the material it is epitaxially grown on, dislocations may occur in the lattice structure of the epitaxial material. The dislocations may extend upwards by a distance from the growth surface. These dislocations may occur from stress and strain resulting from the mismatch between lattice structures of two different materials. The individual atoms in the lattice structure of the base material may exert a force on the individual atoms of the epitaxial material as it is being grown, causing the dislocations. The dislocations may continue for a distance away from the interface until the inherent lattice forces of the epitaxial material overcome the stress and strain.

These dislocations adversely affect electron/hole mobility in the fin and may adversely affect overall device performance. Conventional techniques to address this problem may include using a tall isolation layer in order to separate the dislocations at the bottom of the fin from the exposed portion of the fin (i.e., active region). However, the tall isolation layer may negatively impact the pitch of the fins due to the required high aspect ratio of the epitaxial growth and may increase the overall thickness of the device. A way of reducing the height of the isolation layer, while keeping dislocations away from the exposed fin, may be to "trap" the dislocations below the isolation layer. The dislocations may be trapped by etching a recess into the semiconductor layer below the isolation layer, and growing the high-mobility fin up from the recess. Embodiments by which to grow a high-mobility fin on a silicon SOI substrate by trapping the dislocations of the fin lattice in a recess below a thin isolation layer are described below with reference to FIGS. 1-9.

Referring now to FIG. 1, a cross section view of a structure 100 is shown. The structure 100 may include a semiconductor on insulator (SOI) substrate 102. The SOI substrate 102 may include a SOI layer 108 separated from a semiconductor layer 104 by an isolation layer 106.

The semiconductor layer 104 may be a doped crystalline semiconductor material, a doped polycrystalline semiconductor material, or an amorphous semiconductor material and subsequently annealed to convert to a doped polycrystalline semiconductor material. The doped semiconductor material may be formed with in-situ doping or implantation. The doped semiconductor material may be selected from doped crystalline silicon, polysilicon, doped polycrystalline germanium, a doped silicon-germanium polycrystalline alloy, a doped silicon carbon polycrystalline alloy, a doped silicon-germanium-carbon polycrystalline alloy, doped polycrystalline gallium arsenide, doped polycrystalline indium arsenide, doped polycrystalline indium phosphide, doped polycrystalline III-V compound semiconductor materials, doped polycrystalline II-VI compound semiconductor materials, doped polycrystalline organic semiconductor materials, and other doped polycrystalline compound semiconductor materials.

The semiconductor layer 104 may be doped with n-type dopants or p-type dopants. The dopant concentration of the semiconductor layer 104 may range from approximately 5.0E18 atm/cm$^3$ to approximately 3.0E21 atm/cm$^3$, although lesser and greater dopant concentrations can also be employed. The semiconductor layer 104 may having a thickness $T_{104}$ ranging from approximately 1 micron to approximately 10 microns, although lesser and greater thicknesses can also be employed.

The isolation layer 106 may be composed of a dielectric material, such as, for example, an oxide. The isolation layer 106 may have a thickness $T_{106}$ ranging from approximately 10 nm to approximately 300 nm. In an embodiment, the thickness $T_{106}$ of the isolation layer 106 may be substantially less thick than that of a conventional isolation layer that may be required to form a high-mobility fin using conventional techniques.

In an embodiment, the SOI layer 108 may be composed of single-crystal silicon. If the structure 100 is a p-type field effect transistor (PFET), the SOI layer 108 may be an undoped or lightly doped with n-type dopants, such as for example, phosphorus and arsenic, at a concentration ranging from approximately 1E16 atm/cm$^3$ to approximately 1E19 atm/cm$^3$. If the structure 100 is a n-type field effect transistor (NFET), the SOI layer 108 may be an undoped or lightly doped with p-type dopants, such as for example, boron, at a concentration ranging from approximately 1E16 atm/cm$^3$ to approximately 1E19 atm/cm$^3$. In an embodiment, the SOI layer 108 may be intrinsic (i.e., completely undoped). The SOI layer 108 may have a thickness $T_{108}$ ranging from approximately 10 nm to approximately 300 nm, although greater thicknesses are contemplated, and preferably from approximately 50 nm to approximately 100 nm.

Figure 2:
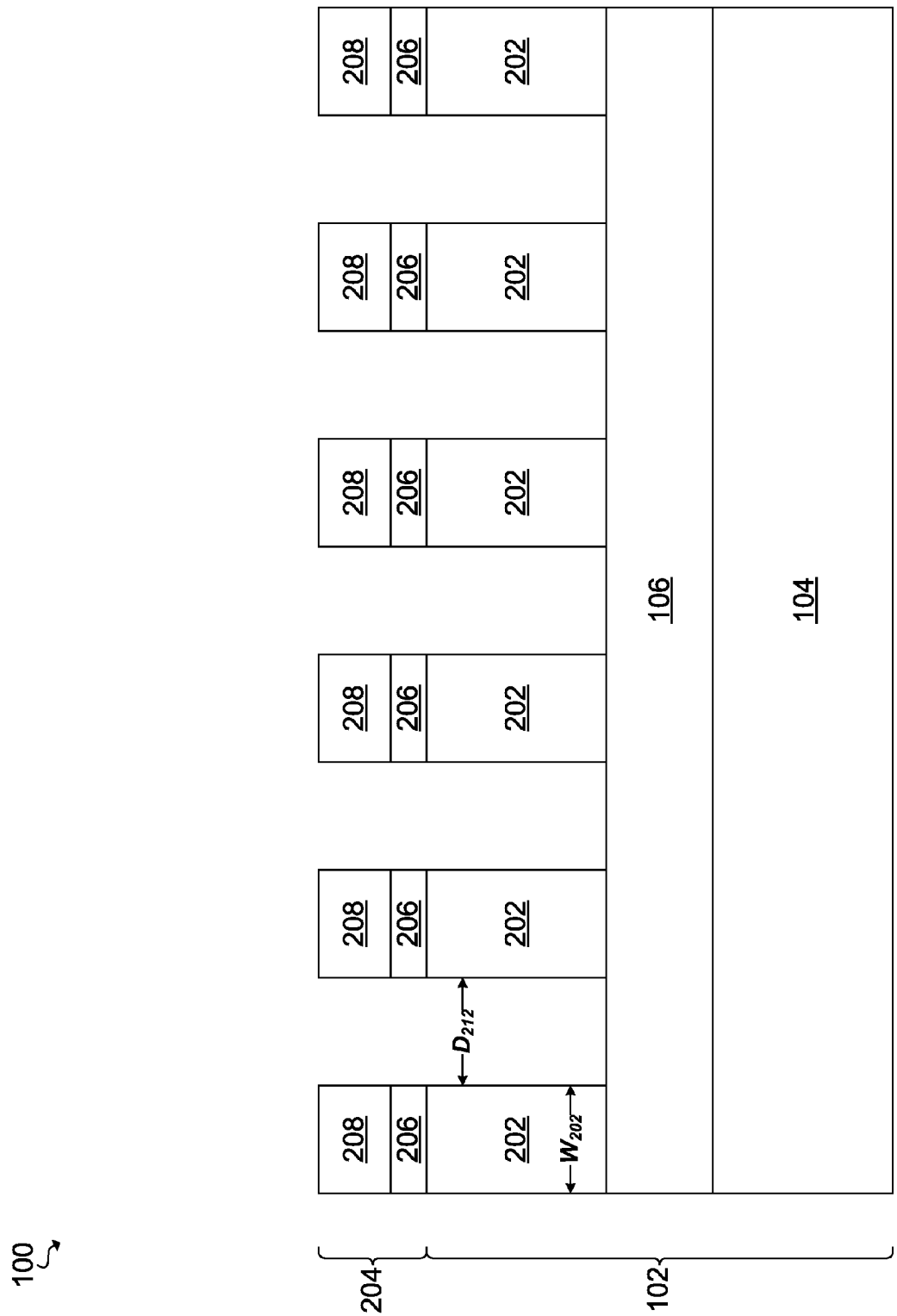
FIG. 2 is a cross section view illustrating forming fins out of an SOI layer present in the structure, according to an embodiment of the present invention.

Referring now to FIG. 2, a cross section view illustrating forming fins 202 out of the SOI layer 108 (FIG. 1) is shown. The fins 202 may be formed using any conventional technique of fin formation, such as, for example, lithographic patterning. In an embodiment, a hardmask 204 may be formed over the SOI layer 108. The hardmask 204 may be formed using any conventional deposition technique, such as, for example, chemical vapor deposition (CVD), plasma-enhanced CVD (PECVD), metal organic chemical vapor deposition (MOCVD), atomic layer deposition (ALD), evaporation, reactive sputtering, chemical solution deposition, spin-on deposition, or other like processes. In an embodiment, the hardmask 204 may include a first layer 206 and a second layer 208. The first layer 206 may be composed of an oxide, a nitride, or an oxynitride and may promote adhesion of the hardmask 204 to the SOI layer 108. The second layer 208 may be composed of an oxide, a nitride, an oxynitride, or hard mask material, such as, for example, tetraethyl orthosilicate (TEOS).

The hardmask 204 may be patterned and etched to form one or more preliminary openings (not shown) in the hardmask to expose a portion of the SOI layer 108. A portion of the SOI layer 108 below the one or more preliminary openings may then be removed selective to the isolation layer 106, exposing an upper surface of the isolation layer 106 and forming the fins. The fins 202 may have a width $W_{202}$ ranging from approximately 7 nm to approximately 30 nm. The fins 202 may be separated from one another by a distance $D_{212}$ ranging from approximately 10 nm to approximately 50 nm.

Figure 3:
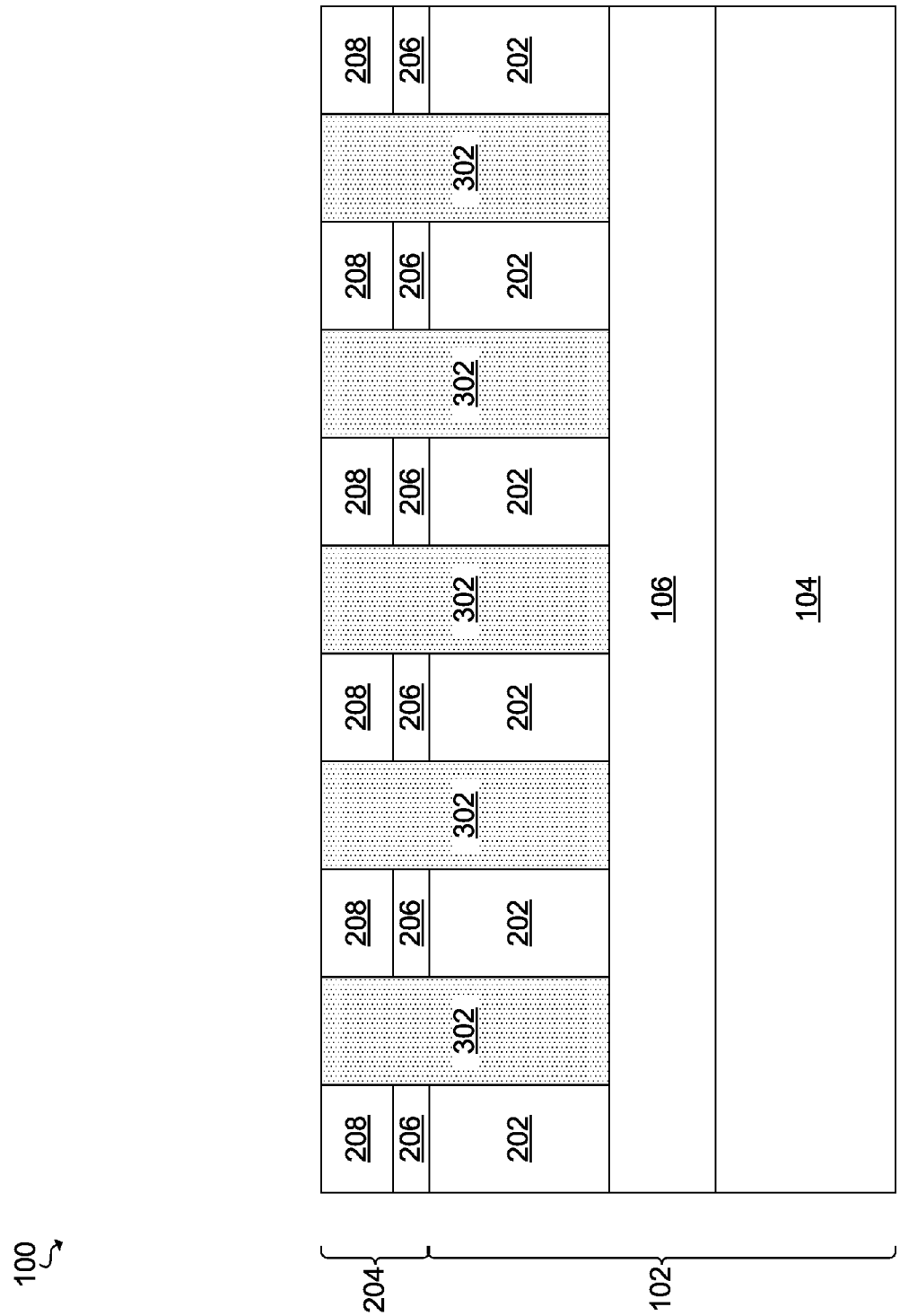
FIG. 3 is a cross section view illustrating depositing a filler material between the fins and a hardmask on the fins, according to an embodiment of the present invention.

Referring now to FIG. 3, a cross section view illustrating depositing a filler material 302 between the fins 202 and the hardmask 204 is shown. The filler material 302 may be deposited using any conventional technique, such as, for example, CVD, PECVD, MOCVD, ALD, evaporation, reactive sputtering, chemical solution deposition, spin-on deposition, or other like processes. In an embodiment, the filler material 302 may be composed of a glass, such as for example, silicate glass, borosilicate glass, or borophosphosilicate glass. In another embodiment, the filler material 302 may be composed of an oxide. After the filler material 302 is deposited, the structure 100 may be subjected to a planarization process, such as, for example, chemical mechanical planarization (CMP) so that an upper surface of the filler material 302 may be substantially flush with an upper surface of the hardmask 204.

Figure 4:
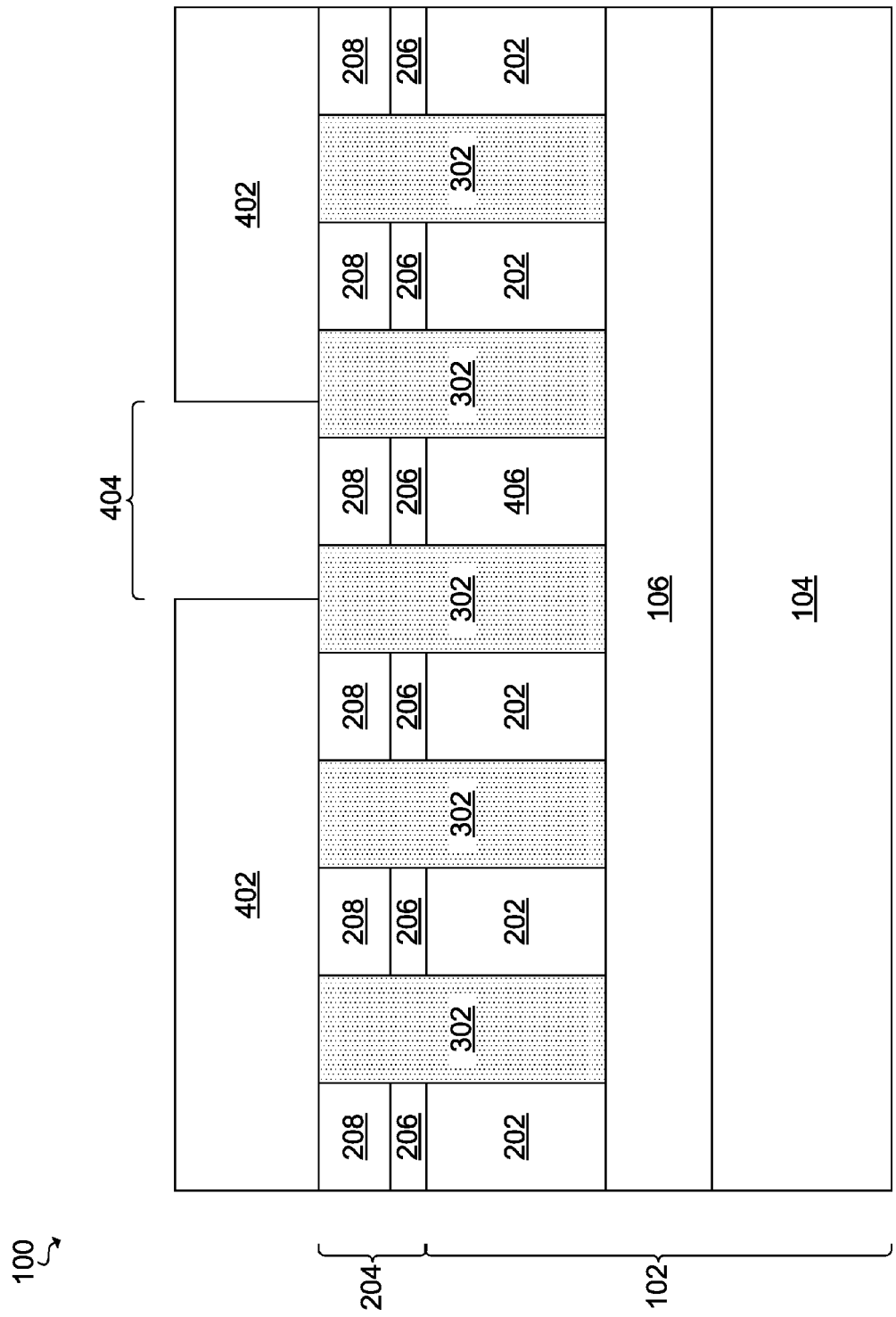
FIG. 4 is a cross section view illustrating forming a patterning layer, according an embodiment of the present invention.

Referring now to FIG. 4, a cross section view illustrating forming a patterning layer 402 is shown. The patterning layer 402 may be formed on the hardmask 204 and the filler material 302. The patterning layer 402 may be formed using any conventional deposition technique, such as, for example, CVD, PECVD, MOCVD, ALD, evaporation, reactive sputtering, chemical solution deposition, spin-on deposition, or other like processes. In an embodiment, the patterning layer 402 may be composed of a hardmask material. In another embodiment, the patterning layer 402 may be composed of a photoresist material. The patterning layer 402 be patterned and etched to form an opening 404 that may expose the hardmask 204 above a single fin 406. In an embodiment, an entire width of the hardmask 204 above the single fin 406 may be exposed along with adjacent portions of the filler material 302. The remaining fins 202 and the hardmask 204 on the remaining fins 202 may remain covered by the patterning layer 402.

Figure 5:
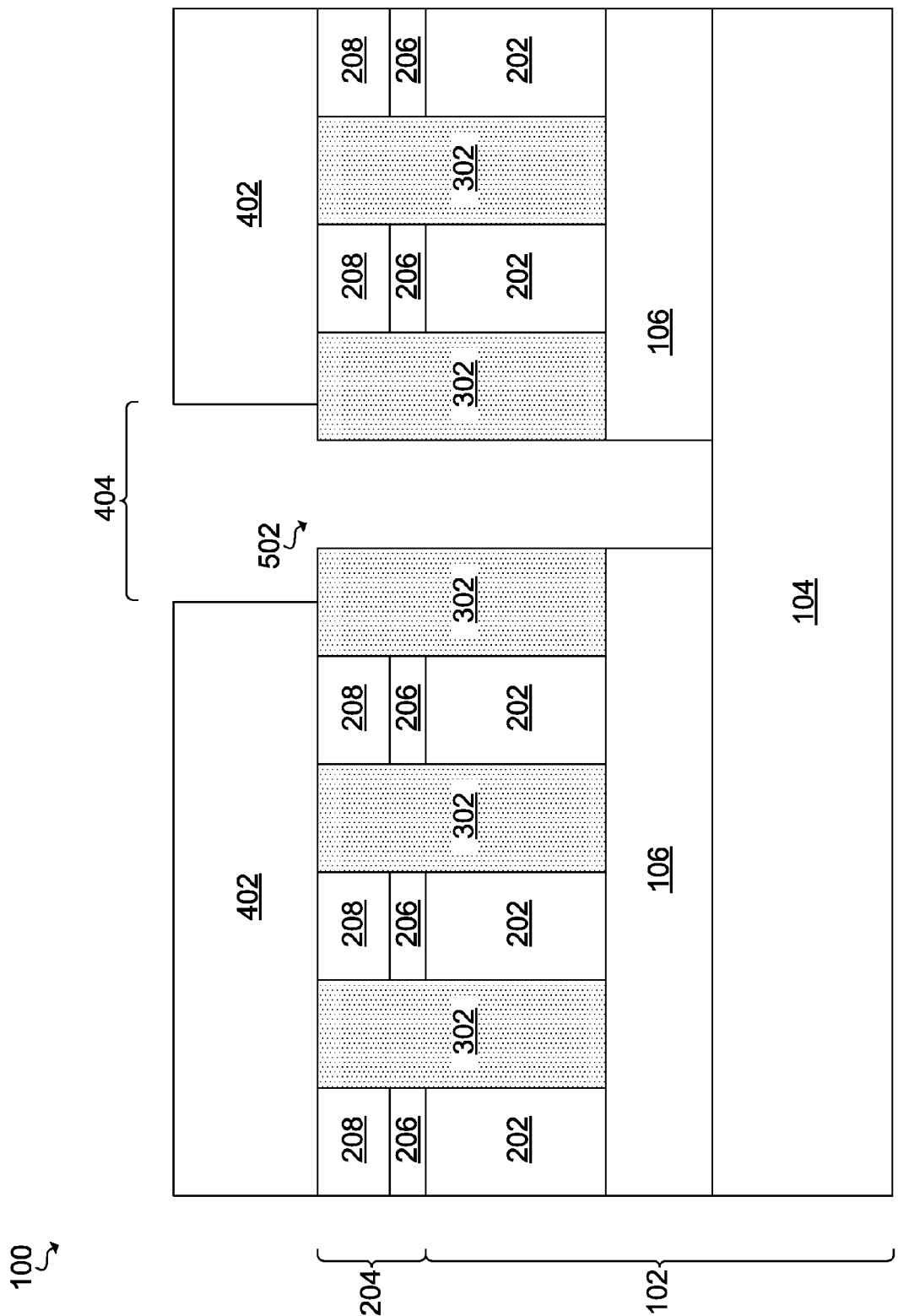
FIG. 5 is a cross section view illustrating forming a fin trench, according to an embodiment of the present invention.

Referring now to FIG. 5, a cross section view illustrating forming a fin trench 502 is shown. The fin trench 502 may be formed by removing the hardmask 204 and the single fin 406 (FIG. 4) exposed by the opening 404. A portion of the isolation layer 106 below the single fin 406 may also be removed to expose an upper surface of the semiconductor layer 104. The fin trench 502 may be formed using any conventional etching technique that may remove the hardmask 204, the single fin 406, and the portion of the isolation layer 106 below the single fin 406 selective to the patterning layer 402 and the filler material 302. In an embodiment, the fin trench 502 may be formed by a dry etching technique, such as, for example, a reactive ion etching (RIE) technique. In an embodiment, the fin trench 502 may be formed by a multi-step etching process to remove each individual layer.

Figure 6:
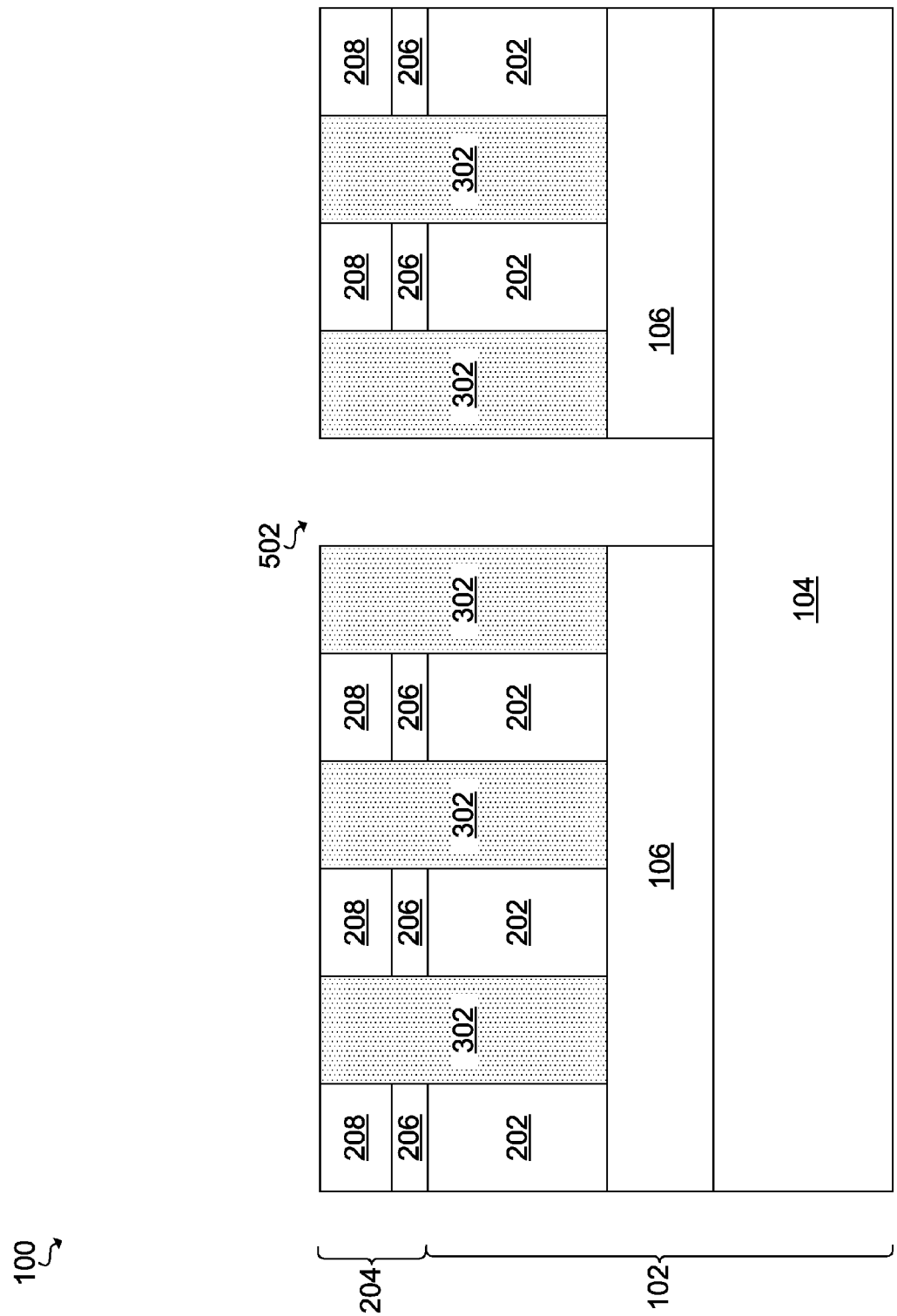
FIG. 6 is a cross section view illustrating removing the patterning layer, according to an embodiment of the present invention.

Referring now to FIG. 6, a cross section view illustrating removing the patterning layer 402 (FIG. 5) is shown. In an embodiment, the patterning layer 402 may be removed by a stripping process that is selective to the hardmask 204, the filler material 302, the isolation layer 106, and the semiconductor layer 104. In another embodiment, the patterning layer 402 may be removed by a planarization technique, such as, for example, CMP.

Figure 7:
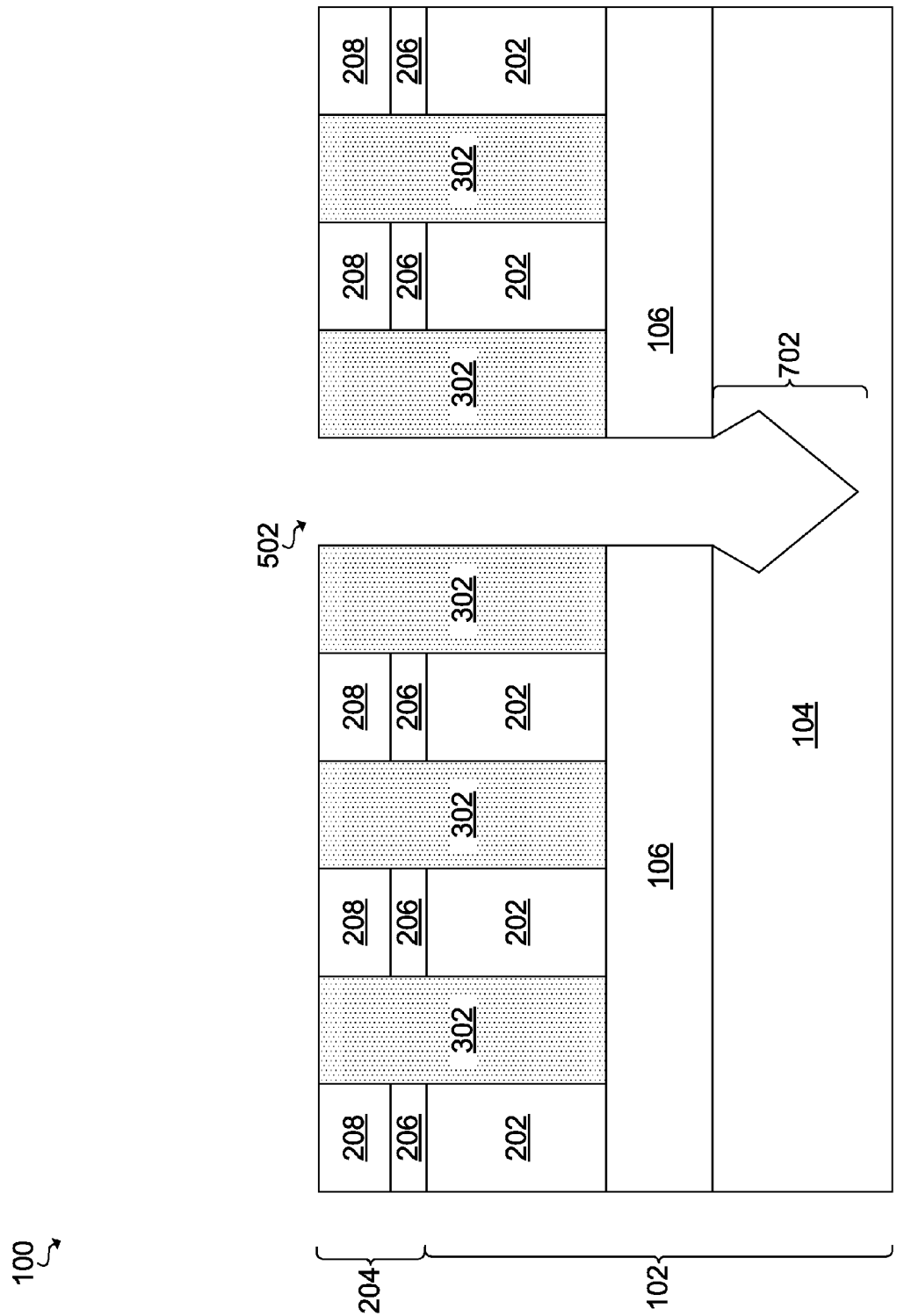
FIG. 7 is a cross section view illustrating forming a recess in an exposed semiconductor layer below a bottom of the fin trench, according to an embodiment of the present invention.

Referring now to FIG. 7, a cross section view illustrating forming a recess 702 in the exposed semiconductor layer 104 below a bottom of the fin trench 502 is shown. The recess 702 may be formed in the semiconductor layer 104 below the isolation layer 106. The recess 702 may be formed by etching the exposed semiconductor layer 104 selective to the filler material 302 and the hardmask 204. In an embodiment, the recess 702 may be formed by performing an anisotropic wet etch, using an etchant such as, for example $NH_4OH$. The anisotropic wet etch may etch the silicon in the semiconductor layer 104 along the 1:1:1 plane, thereby resulting in the recess 702 having an angled profile, otherwise known as a faceted or sigma shape.

Figure 8:
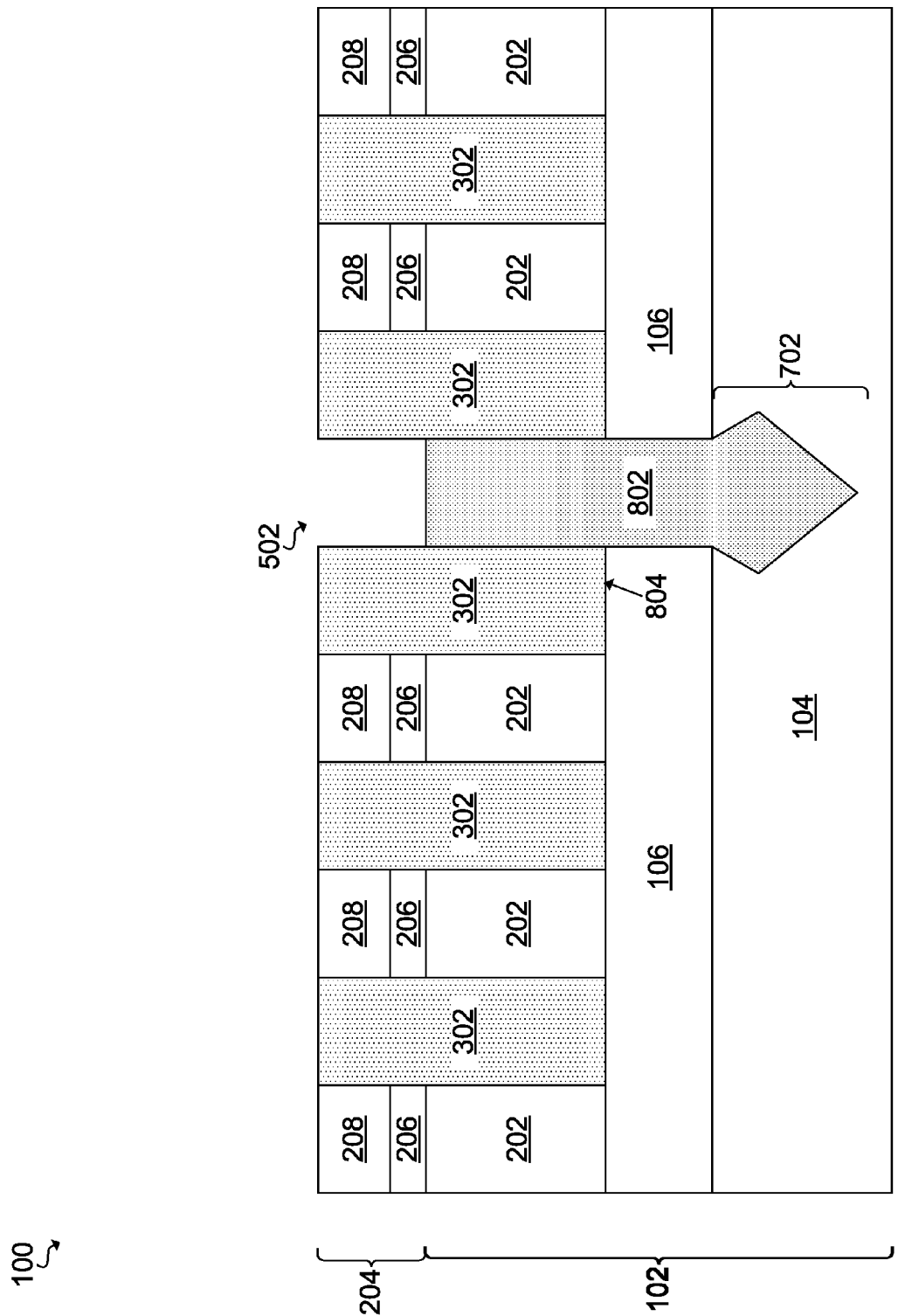
FIG. 8 is a cross section view illustrating forming a high-mobility fin in the recess and the fin trench, according to an embodiment of the present invention.

Referring now to FIG. 8, a cross section view illustrating forming a high-mobility fin 802 in the recess 702 and the fin trench 502 is shown. In an embodiment, the high-mobility fin 802 may be formed by epitaxially growing a semiconductor material, starting in the recess 702, using a conventional epitaxial growth process. The high-mobility 802 may extend from the recess 702 to above an upper surface 804 of the isolation layer 106. Any deformations in the lattice of the semiconductor material of the high mobility fin 802 resulting from a lattice mismatch between the high-mobility fin 802 and the semiconductor layer 104 may remain trapped in the recess 702, below the isolation layer 106.

Unlike conventional techniques, in which a high-mobility fin is grown on an upper surface of a semiconductor layer, and a tall isolation layer is used to separate dislocations in base of the high-mobility fin, embodiments of the present invention trap the dislocations in the recess 702 formed in the semiconductor layer 104 below the isolation layer 106. Because the isolation layer 106 is not needed to separate the dislocations from the exposed portion (i.e., active region) of the high-mobility fin 802, it may have a smaller height than conventional isolation layers used in conventional techniques. The reduced height of the isolation layer 106 may reduce the need to form high-aspect ratio and ultra-high aspect ratio high-mobility fins, which may, in turn, may allow for the formation of thin high-mobility fins through a simpler, more affordable fabrication process. In an embodiment, the high-mobility fin 802 may be grown such that it has a height that is substantially equal to the height of the fins 202.

In an embodiment, the high-mobility fin 802 may be composed of a crystalline or polycrystalline Group IV semiconductor material, such as, for example, silicon carbon (SiC), germanium (Ge), silicon germanium (SiGe), or silicon germanium carbon (SiGeC). In another embodiment, the high-mobility fin 802 may be composed of a Group III-V semiconductor material such as crystalline or polycrystalline gallium arsenide (GaAs), indium arsenide (InAs), or indium phosphide (InP).

Figure 9:
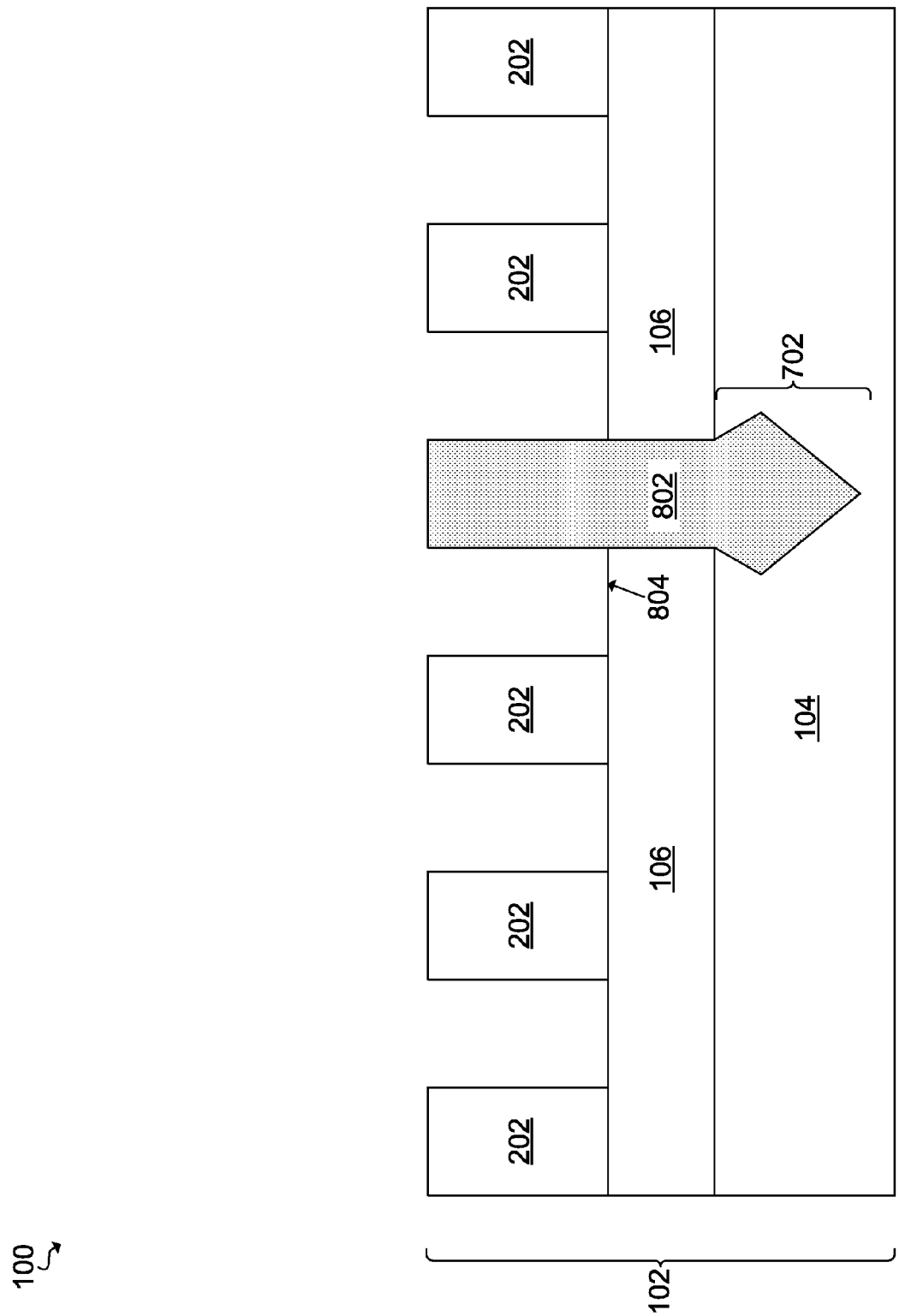
FIG. 9 is a cross section view illustrating removing the filler material and the hardmask, according to an embodiment of the present invention.

Referring now to FIG. 9, a cross section view illustrating removing the filler material 302 and the hardmask 204 is shown. In an embodiment, the hardmask 204 may be removed selective to the filler material 302, the fins 202, and the high-mobility fin 802 by an etching process, such as, for example, RIE. In another embodiment, the hardmask may be removed by a planarization process, such as, for example, CMP. The filler material 302 may be removed selective to the fins 202, the high-mobility fin 802, and the isolation layer 106. In an embodiment, the filler material 302 may be removed by a conventional stripping process, using a wet or dry etch such as, for example a buffered hydrofluoric acid (BHF) etch, dilute hydrofluoric acid (DHF) etch, SiConi™ etch, or chemical oxide removal (COR). Subsequently, spacers, gates, and contacts, etc. may be formed on the structure 100 to form a finFET device.

Embodiments of the present invention may allow for the fabrication of a high-mobility fin in a hybrid finFET in which lattice dislocations caused by epitaxial growth are trapped in a recess formed in a semiconductor layer below an isolation layer. By trapping the lattice dislocations of the high-mobility fin in the recess below the isolation layer, the isolation layer may be thinner than a conventional isolation layer, which is typically tall enough to separate dislocations in a base of a high-mobility fin grown on an upper surface of the semiconductor layer from an active region of the high-mobility fin. The lower height may allow for the formation of thinner high-mobility fins without the complications and costs associated with high aspect ratio and ultra-high aspect ratio techniques, and may allow for a tighter fin pitch. In addition, the thinner isolation layer may allow for overall thinner finFET devices, a key feature as device size continues to be scaled down.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming a recess in a semiconductor on insulator (SOI) substrate, the recess located in a semiconductor layer and below an isolation layer; and
    epitaxially growing a material having high electron mobility properties in the recess to form a high-mobility fin, the high-mobility fin having one or more crystalline lattice dislocations only in the recess, and the high-mobility fin extending above the isolation layer,
    wherein the forming the recess in the SOI substrate comprises:
        removing a fin to expose a portion of the isolation layer, wherein the fin comprises a portion of an SOI layer;
        removing the portion of the isolation layer to expose the semiconductor layer; and
        removing a portion of the semiconductor layer directly below the portion of the isolation layer.

2. The method of claim 1, wherein the removing the portion of the semiconductor layer directly below the portion of the isolation layer comprises:
    performing a wet etching process to form a faceted recess.

3. The method of claim 1, wherein the removing the fin to expose the portion of the isolation layer comprises:
    depositing a filler material on the isolation layer adjacent to the fin, the filler material in direct contact with a sidewall of fin; and
    removing the fin selective to the filler material.

4. The method of claim 3, wherein the depositing the filler material on the isolation layer adjacent to the fin comprises:
    depositing a glass material on the isolation layer.

5. The method of claim 3, wherein the depositing the filler material on the isolation layer adjacent to the fin comprises:
    depositing an oxide on the isolation layer.

6. The method of claim 1, wherein the epitaxially growing the material having high electron mobility properties in the recess to form the high-mobility fin comprises:
    growing an epitaxial material comprising germanium on a surface of the semiconductor layer exposed by the recess.

7. The method of claim 1, wherein the isolation layer is a thin isolation layer having a thickness ranging from approximately 10 nm to approximately 300 nm.

8. A method comprising:
    forming a fin on an isolation layer, the fin comprising a portion of a semiconductor on insulator (SOI) layer;
    forming a hardmask on the fin;
    depositing a filler material on the isolation layer adjacent to the fin, the filler material directly contacting a sidewall of the fin and a sidewall of the hardmask;
    forming a patterning layer on the hardmask and the filler material;
    forming an opening in the patterning layer, the opening exposing the hardmask and only a portion of the filler material;
    forming a fin trench by removing the hardmask, the fin, and a portion of the isolation layer below the fin selective to the filler material, the fin trench exposing a portion of a semiconductor layer;
    forming a recess in the exposed portion of the semiconductor layer, the recess located below the isolation layer; and
    epitaxially growing a material having high electron mobility properties in the recess to form a high-mobility fin, the high-mobility fin having one or more crystalline lattice dislocations located only in the recess, and the high-mobility fin extending above the isolation layer.

9. The method of claim 8, further comprising:
    removing the patterning layer;
    removing the hardmask; and
    removing the filler material selective to the high-mobility fin and the isolation layer.

10. The method of claim 8, wherein the forming the hardmask on the fin comprises:
    forming a first layer on the fin; and
    forming a second layer on the first layer.

11. The method of claim 8, wherein the isolation layer is a thin isolation layer having a thickness ranging from approximately 10 nm to approximately 300 nm.

12. The method of claim 8, wherein the forming the recess in the exposed portion of the semiconductor layer comprises:
    removing a portion of the semiconductor layer using a wet etching process to form a faceted recess.

13. The method of claim 8, wherein the epitaxially growing the material having high electron mobility properties in the recess to form the high-mobility fin comprises:
    growing an epitaxial material comprising germanium on a surface of the semiconductor layer exposed by the recess.

14. The method of claim 8, wherein the depositing the filler material on the isolation layer adjacent to the fin comprises:
    depositing a glass material on the isolation layer and the hardmask; and
    planarizing the glass material.

15. The method of claim 8, wherein the depositing the filler material on the isolation layer adjacent to the fin comprises:
    depositing an oxide on the isolation layer and the hardmask; and
    planarizing the oxide.

* * * * *